United States Patent
Abe et al.

(10) Patent No.: US 8,267,041 B2
(45) Date of Patent: Sep. 18, 2012

(54) PLASMA TREATING APPARATUS

(75) Inventors: Toshiji Abe, Tokyo-To (JP); Toshiki Takahashi, Tokyo-To (JP); Hiroyuki Matsuura, Tokyo-To (JP)

(73) Assignee: Tokyo Electron Limited, Tokyo (JP)

( * ) Notice: Subject to any disclaimer, the term of this patent is extended or adjusted under 35 U.S.C. 154(b) by 365 days.

(21) Appl. No.: 11/661,135

(22) PCT Filed: Aug. 30, 2005

(86) PCT No.: PCT/JP2005/015767
§ 371 (c)(1),
(2), (4) Date: Feb. 26, 2007

(87) PCT Pub. No.: WO2006/027972
PCT Pub. Date: Mar. 16, 2006

(65) Prior Publication Data
US 2008/0093024 A1    Apr. 24, 2008

(30) Foreign Application Priority Data
Sep. 6, 2004  (JP) .................... 2004-257994

(51) Int. Cl.
| C23C 16/50 | (2006.01) |
| C23C 16/503 | (2006.01) |
| C23C 16/505 | (2006.01) |
| C23C 16/507 | (2006.01) |
| C23C 16/509 | (2006.01) |
| C23C 16/52 | (2006.01) |
| C23F 1/00 | (2006.01) |
| C23C 16/06 | (2006.01) |
| C23C 16/22 | (2006.01) |

(52) U.S. Cl. .............. 118/723 E; 118/723 ER; 118/663; 156/345.43; 156/345.44; 156/345.45; 156/345.46; 156/345.47; 156/345.31; 156/345.22; 315/111.2; 363/21.01

(58) Field of Classification Search ............... 118/723 E, 118/723 ER, 663; 156/345.43, 345.44, 345.45, 156/345.46, 345.47, 345.31, 345.22; 315/111.2; 363/21.01
See application file for complete search history.

(56) References Cited

U.S. PATENT DOCUMENTS
3,704,219 A * 11/1972 McDowell ............... 204/192.13
(Continued)

FOREIGN PATENT DOCUMENTS
EP       1 381 257        1/2004
(Continued)

OTHER PUBLICATIONS

Notification of Transmittal of Translation of the International Preliminary Report on Patentability (Form PCT/IB/338) in connection with PCt/JP2005/015767, dated Jan. 2004.

(Continued)

Primary Examiner — Rudy Zervigon
(74) Attorney, Agent, or Firm — Smith, Gambrell & Russell, LLP

(57) ABSTRACT

A plasma treating apparatus adapted to provide a predetermined plasma treatment to an object W to be treated comprises a processing chamber 12 configured to be capable of being vacuumed, an object holding means 20 adapted to hold the object to be treated, a high frequency power source 58 adapted to generate high frequency voltage, a plasma gas supplying means 38 adapted to supply a plasma generating gas to be treated to generate plasma to the processing chamber, a pair of plasma electrodes 56, 56B connected to the output side of the high frequency power source via wirings 60 to generate plasma in the processing chamber, the pair of plasma electrodes being brought into an excited electrode state. In addition, a high frequency matching means 72 is provided in the middle of the wirings. In this case, each of the plasma electrodes 56A, 56B is not grounded. Thus, the plasma density can be increased, and the efficiency of generating plasma can be enhanced.

15 Claims, 8 Drawing Sheets

U.S. PATENT DOCUMENTS

| | | | | |
|---|---|---|---|---|
| 4,557,819 | A | * | 12/1985 | Meacham et al. ........ 204/298.08 |
| 4,763,087 | A | * | 8/1988 | Schrader ..................... 333/101 |
| 4,956,582 | A | * | 9/1990 | Bourassa ................. 315/111.21 |
| 5,140,223 | A | * | 8/1992 | Gesche et al. ........... 315/111.21 |
| 5,178,682 | A | * | 1/1993 | Tsukamoto et al. .......... 118/722 |
| 5,195,045 | A | * | 3/1993 | Keane et al. .................. 702/107 |
| 5,288,684 | A | * | 2/1994 | Yamazaki et al. ............ 118/722 |
| 5,298,939 | A | * | 3/1994 | Swanson et al. ................ 355/53 |
| 5,387,842 | A | * | 2/1995 | Roth et al. ............... 315/111.21 |
| 5,407,524 | A | * | 4/1995 | Patrick et al. ................... 216/59 |
| 5,413,664 | A | * | 5/1995 | Yagi et al. ................ 156/345.32 |
| 5,414,324 | A | * | 5/1995 | Roth et al. ............... 315/111.21 |
| 5,474,648 | A | * | 12/1995 | Patrick et al. ................... 438/10 |
| 5,552,927 | A | * | 9/1996 | Wheatly et al. ............... 359/359 |
| 5,556,549 | A | * | 9/1996 | Patrick et al. ................... 216/61 |
| 5,643,364 | A | * | 7/1997 | Zhao et al. ................ 118/723 E |
| 5,876,663 | A | * | 3/1999 | Laroussi ........................ 422/23 |
| 6,015,503 | A | * | 1/2000 | Butterbaugh et al. .......... 216/66 |
| 6,046,546 | A | * | 4/2000 | Porter et al. ............. 315/111.21 |
| 6,239,018 | B1 | * | 5/2001 | Liu et al. ...................... 438/624 |
| 6,279,504 | B1 | * | 8/2001 | Takaki et al. ............. 118/723 E |
| 6,288,493 | B1 | * | 9/2001 | Lee et al. .................. 315/111.21 |
| 6,311,638 | B1 | * | 11/2001 | Ishii et al. ............. 118/723 MW |
| 6,467,491 | B1 | * | 10/2002 | Sugiura et al. .................. 134/1.3 |
| 6,568,346 | B2 | * | 5/2003 | Pu et al. ..................... 118/723 I |
| 6,583,572 | B2 | * | 6/2003 | Wicker et al. ............. 315/111.51 |
| 6,583,992 | B2 | * | 6/2003 | Porter et al. ................. 363/21.01 |
| 6,707,253 | B2 | * | 3/2004 | Sumida et al. ............ 315/39.53 |
| 6,774,569 | B2 | * | 8/2004 | de Vries et al. .......... 315/111.21 |
| 6,792,889 | B2 | * | 9/2004 | Nakano et al. ............. 118/723 E |
| 6,819,052 | B2 | * | 11/2004 | Kitamura et al. ......... 315/111.21 |
| 6,821,906 | B2 | * | 11/2004 | Wada et al. ................... 438/708 |
| 7,004,107 | B1 | * | 2/2006 | Raoux et al. ............. 118/723 E |
| 7,025,831 | B1 | * | 4/2006 | Butterbaugh et al. ........ 118/724 |
| 7,095,178 | B2 | * | 8/2006 | Nakano et al. ............ 315/111.21 |
| 7,097,712 | B1 | * | 8/2006 | Yamazaki et al. ............. 118/715 |
| 7,157,857 | B2 | * | 1/2007 | Brouk et al. .............. 315/111.21 |
| 7,169,256 | B2 | * | 1/2007 | Dhindsa et al. ........... 156/345.47 |
| 7,199,678 | B2 | * | 4/2007 | Matsuno ....................... 333/17.3 |
| 7,264,676 | B2 | * | 9/2007 | Lai et al. ....................... 118/728 |
| 7,320,941 | B2 | * | 1/2008 | Nishida et al. ................. 438/707 |
| 7,630,220 | B2 | * | 12/2009 | Kotani et al. ..................... 363/25 |
| 7,812,278 | B2 | * | 10/2010 | Shannon .................. 219/121.41 |
| 7,905,982 | B2 | * | 3/2011 | Howald et al. ............ 156/345.48 |
| 8,053,991 | B2 | * | 11/2011 | Kim et al. ................. 315/111.21 |
| 8,120,259 | B2 | * | 2/2012 | Kim et al. ................. 315/111.21 |
| 2002/0125223 | A1 | * | 9/2002 | Johnson et al. .......... 219/121.43 |
| 2002/0148563 | A1 | * | 10/2002 | Carlson et al. ........... 156/345.31 |
| 2003/0097984 | A1 | * | 5/2003 | Nakano et al. ................ 118/712 |
| 2003/0164143 | A1 | | 9/2003 | Toyoda et al. |
| 2004/0023513 | A1 | * | 2/2004 | Aoyama et al. ............... 438/778 |
| 2004/0173314 | A1 | * | 9/2004 | Nishio et al. ............. 156/345.33 |
| 2005/0016456 | A1 | * | 1/2005 | Taguchi et al. ........... 118/723 E |
| 2005/0016687 | A1 | * | 1/2005 | Shinriki et al. .......... 156/345.52 |
| 2005/0056369 | A1 | * | 3/2005 | Lai et al. .................. 156/345.44 |
| 2005/0255712 | A1 | * | 11/2005 | Kato et al. ..................... 438/791 |
| 2005/0264218 | A1 | * | 12/2005 | Dhindsa et al. .......... 315/111.21 |
| 2006/0144519 | A1 | * | 7/2006 | Kitamura et al. ........ 156/345.44 |
| 2007/0196011 | A1 | * | 8/2007 | Cox et al. ....................... 382/145 |
| 2008/0048632 | A1 | * | 2/2008 | Kotani et al. .................. 323/293 |
| 2008/0053615 | A1 | * | 3/2008 | Sago et al. ............... 156/345.47 |
| 2008/0093024 | A1 | * | 4/2008 | Abe et al. ................. 156/345.44 |
| 2008/0173403 | A1 | * | 7/2008 | Nishida et al. ........... 156/345.49 |
| 2008/0190893 | A1 | * | 8/2008 | Mori et al. ....................... 216/61 |
| 2009/0026172 | A1 | * | 1/2009 | Kitabata et al. ................. 216/84 |
| 2009/0255800 | A1 | * | 10/2009 | Koshimizu .................... 204/164 |
| 2010/0176085 | A1 | * | 7/2010 | Mizukami et al. .............. 216/61 |
| 2010/0258529 | A1 | * | 10/2010 | Mori et al. ....................... 216/67 |

FOREIGN PATENT DOCUMENTS

| | | | |
|---|---|---|---|
| JP | 02-159027 | | 6/1990 |
| JP | 3-27120 | | 3/1991 |
| JP | 03-224222 | | 10/1991 |
| JP | 05031735 A | * | 2/1993 |
| JP | 05138658 A | * | 6/1993 |
| JP | 05-251391 | | 9/1993 |
| JP | 2001-44780 | | 2/2001 |
| JP | 2001-044780 | | 2/2001 |
| JP | 2001104776 A | * | 4/2001 |
| JP | 2002-141292 | | 5/2002 |
| JP | 2002-280378 | | 9/2002 |
| JP | 2003-163099 | | 6/2003 |
| JP | 2003-264100 | | 9/2003 |
| JP | 2003-298378 | | 10/2003 |
| JP | 2007194582 A | * | 8/2007 |

OTHER PUBLICATIONS

International Preliminary Report on Patentability (Form PCT/IB/373) in connection with PCt/JP2005/015767, dated Jan. 2004.

Translation of Written Opinion (Form PCT/ISA/237) in connection with PCt/JP2005/015767, dated Jan. 2004.

Supplementary European Search Report issued on Dec. 30, 2008.

Japanese Office Action issued on Jul. 1, 2008.

* cited by examiner

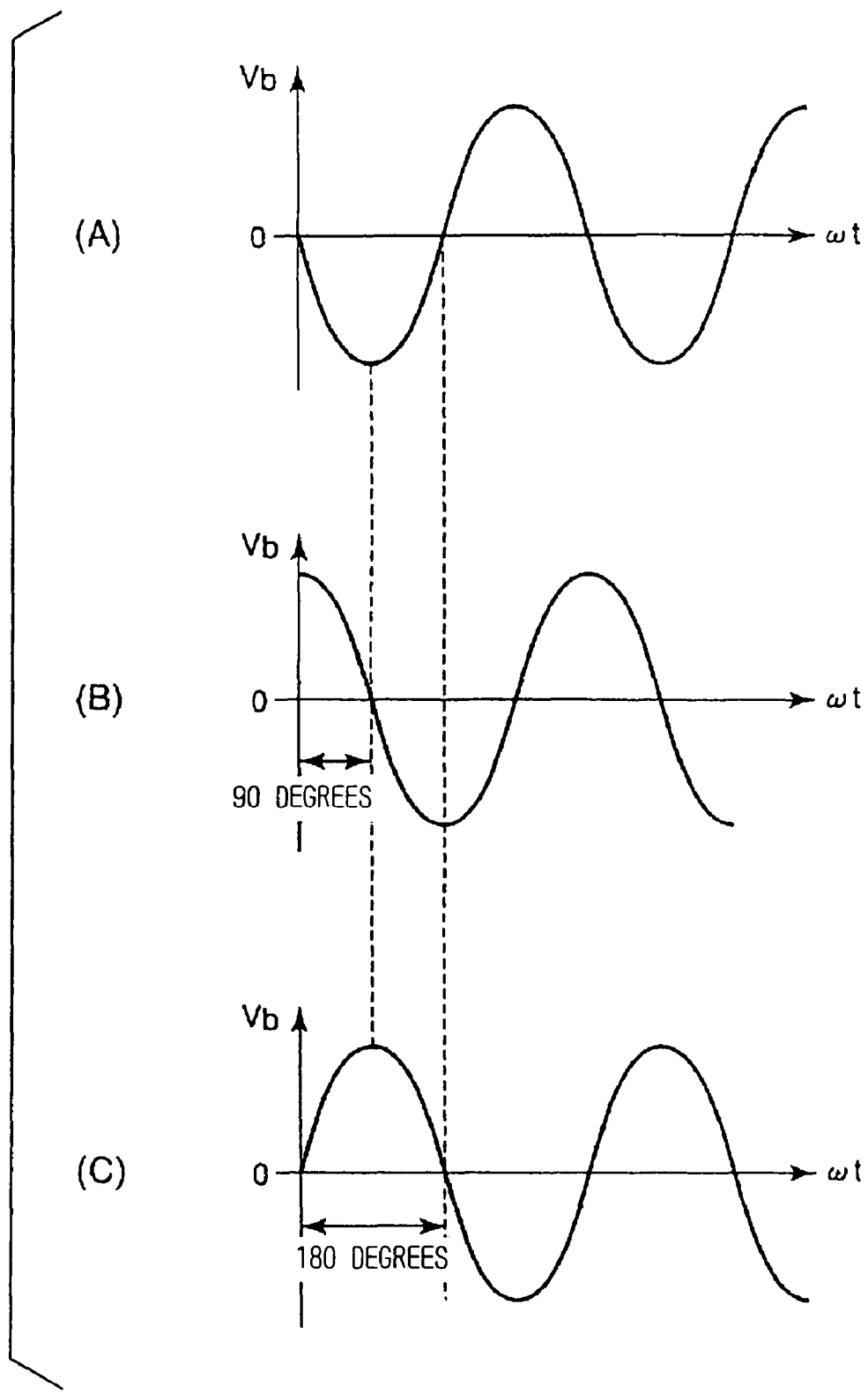
F I G. 6

PLASMA TREATING APPARATUS

BACKGROUND OF THE INVENTION

1. Field of the Invention

The present invention relates to a plasma treating apparatus for providing a plasma treatment, such as film forming or etching, to an object to be treated, such as a semiconductor wafer or the like.

2. Background Art

Generally, in order to produce semiconductor integrated circuits, various treatments including film forming, etching, oxidation, diffusion, modification and removal of naturally oxidized membranes are performed. In the case of performing these treatments in a vertical type, such as the so-called batch type heating apparatus, semiconductor wafers are transferred from a cassette capable of containing multiple sheets, for example 25 sheets, of semiconductor wafers onto a vertical type wafer boat, wherein the respective wafers are supported on the wafer boat in a multi-staged fashion. Depending on the wafer size, the wafer boat can contain 30 to 150 sheets of wafers. Thereafter, the wafer boat is loaded in a processing chamber from below, which chamber is capable of exhaustion, and the interior of the processing chamber is then kept airtight. Then, a predetermined heating treatment is performed while controlling various process conditions, such as flow rates of processing gases, processing pressure, processing temperature or the like.

Recently, needs for more highly integrated and refined semiconductor integrated circuits have been increased, and a reduction of heat history in the production process for semiconductor integrated circuits is also desired in view of enhancement of the properties of circuit elements. Under such circumstances, various processing apparatuses utilizing plasma have been proposed because of possibility to perform an intended treatment, even without subjecting wafers to a significantly high temperature, in a vertical batch type processing apparatus (e.g., see Patent Documents 1, 2, 3, 4, 5).

For example, in a conventional plasma treating apparatus, for example, a pair of electrodes are provided respectively opposed to the center of a cylindrical processing chamber able to be vacuumed, on the outside of a side wall of the processing chamber. One of the electrodes is connected with a high frequency power source for generating plasma, and the other electrode is grounded, so as to generate plasma in the whole interior of the processing chamber by applying a high frequency voltage between both the electrodes. The semiconductors wafers are supported in a multi-staged fashion at an approximately central portion in the processing chamber, and a gas nozzle adapted to introduce a gas used for generating, for example plasma, is arranged on one side of the wafers. Thus, the wafers can be subjected to a plasma treatment by a heater provided surrounding the outer periphery of the processing chamber while being maintained to be heated at a predetermined temperature.

Now, a high frequency circuit including the aforementioned high frequency power source will be described. FIG. 8 is a diagram showing an equivalent circuit for a conventional high frequency circuit including a high frequency power source. In FIG. 8, reference numerals 2A, 2B denote a pair of plasma electrodes provided on the side of a processing chamber. Both of the plasma electrodes 2A, 2B are connected with a high frequency power source 6 of 13.56 MHz, for example, via wirings 4. By applying a high frequency between these plasma electrodes 2A, 2B, plasma P is generated between both the plasma electrodes 2A, 2B in a vacuumed state. In this case, the plasma P acts on the high frequency electrode 6 as a load and can be expressed equivalently as a series circuit consisting of a capacitor C, a coil L and a resistance R. Either one of the two plasma electrodes, for example, the lower plasma electrode 2B in the drawing, is grounded.

In the middle of the wirings 4, a high frequency matching circuit 8 is provided to perform matching of impedance in order to cancel a reflected wave from the load due to the plasma P, thereby to enhance efficiency of plasma generation. The high frequency matching circuit 8 comprises a first variable capacitor C1 connected in series with the plasma electrode 2A, a first coil L1, and a second variable capacitor C2 connected in parallel with the load of the plasma P on the side of the high frequency power source 6. It should be appreciated that the high frequency matching circuit 8 in the connected state described above is generally referred to as an inversed L type matching circuit.

In the high frequency matching circuit 8, by automatically adjusting the first and second variable capacitors C1, C2 to cancel the reflected wave on the side of the load of plasma P, the matching of impedance can be performed. As an alternative of the high frequency matching circuit 8, for example as shown in FIG. 9(A), it may be constructed with the first and second variable capacitors C1, C2 respectively connected in series with the load of plasma P, and a first variable coil L2 connected with the connection point between the two variable capacitors C1, C2 as well as connected in parallel with the load of plasma P via the other wiring 4. Otherwise, as shown in FIG. 9(B), the frequency matching circuit 8 may be constructed with a first and a second variable coils L2, L3 respectively connected in series with the load of plasma P, and a capacitor C3 connected with the connection point between the two variable coils L2, L3 as well as connected in parallel with the load of plasma P via the other wiring 4. It should be appreciated that the circuit construction as shown in FIG. 9 is generally referred to as a T type matching circuit.

Patent Document 1: TOKUKAIHEI No. 3-224222, KOHO
Patent Document 2: TOKUKAIHEI No. 5-251391, KOHO
Patent Document 3: TOKUKAI No. 2002-280378, KOHO
Patent Document 4: TOKUKAI No. 2001-44780, KOHO
Patent Document 1: TOKUKAI No. 2003-264100, KOHO Because the plasma electrode 2B is grounded, a voltage Vab applied between both the plasma electrodes 2A, 2B in the high frequency matching circuit 8 described above is a sinusoidal wave as shown in FIG. 10.

In such a high frequency circuit, high production efficiency of highly powered plasma is required. However, in the high frequency circuit as described above, the plasma density to be obtained is not so high, thus the plasma production efficiency can not be enhanced sufficiently as desired.

SUMMARY OF THE INVENTION

In view of the above problems, the present invention was made to address them effectively. Therefore, it is an object of the present invention to provide a plasma treating apparatus which can increase the plasma density and enhance the plasma production efficiency.

The present invention is a plasma treating apparatus adapted to provide a predetermined plasma treatment to an object to be treated, comprising: a processing chamber capable of being vacuumed; an object holding means adapted to hold the object; a high frequency power source adapted to generate high frequency voltage; a plasma gas supplying means adapted to supply a plasma generating gas to be treated to generate plasma to the processing chamber; a pair of plasma electrodes connected to the output side of the high frequency power source via wirings to generate plasma in the processing chamber, the pair of plasma electrodes being brought into an excited electrode state; and a high frequency matching means provided in the middle of the wirings and having impedance; wherein each plasma electrode is not grounded.

As described above, since the pair of plasma electrodes provided in the processing chamber are brought into an excited electrode state (or hot state), without grounding, by connecting them with an output side of the high frequency power source, the voltage to be applied to both the plasma electrodes can be significantly increased by properly adjusting the impedance, thus increasing the plasma density as well as enhancing the efficiency of generating plasma.

The present invention is the plasma treating apparatus, wherein the high frequency matching means includes one or more first reactance elements connected in parallel with a load of plasma between the plasma electrodes and having either one property of inductive reactance or capacitive reactance, and a plurality of second reactance elements connected in series with each plasma electrode and having another property than that of the first reactance elements.

The present invention is the plasma treating apparatus, wherein at least either one of the first or second reactance elements is variable.

The present invention is the plasma treating apparatus, wherein a detector for detecting the reflected wave generated on the side of the plasma electrodes is provided in the middle of the wirings between the high frequency matching means and the high frequency power source; and wherein the impedance of the high frequency matching means is controlled by a control unit based on a signal transmitted from the detector.

The present invention is the plasma treating apparatus, wherein the control unit controls the impedance of the high frequency matching means such that the reflected wave generated on the side of the plasma electrodes becomes zero.

The present invention is the plasma treating apparatus, wherein the first reactance elements comprise a pair of capacitors with variable capacitance; and wherein the second reactance elements comprise a pair of coils.

The present invention is the plasma treating apparatus, wherein the first reactance elements comprise a pair of coils with variable inductance; and wherein the second reactance elements comprise a pair of capacitors.

The present invention is the plasma treating apparatus, wherein the first reactance elements comprise a single capacitor with variable capacitance; and wherein the second reactance elements comprise a pair of coils.

The present invention is the plasma treating apparatus, wherein the single capacitor is arranged in the wirings, on the side of the plasma electrodes with respect to the pair of coils.

The present invention is the plasma treating apparatus, wherein the single capacitor is arranged in the wirings, opposite to the plasma electrodes with respect to the pair of coils.

The present invention is the plasma treating apparatus, wherein the first reactance elements comprise a single coil with variable inductance; and wherein the second reactance elements comprise a pair of capacitors.

The present invention is the plasma treating apparatus, wherein the single coil is arranged in the wirings, on the side of the plasma electrodes with respect to the pair of capacitors.

The present invention is the plasma treating apparatus, wherein the single coil is arranged in the wirings, opposite to the plasma electrodes with respect to the pair of capacitors.

The present invention is the plasma treating apparatus, wherein the processing chamber is a vertical type processing chamber which can contain multiple sheets of the objects to be treated.

The present invention is the plasma treating apparatus, wherein the processing chamber is a sheet-fed type processing chamber which can contain one sheet of the object to be treated for each operation.

As discussed above, according to the plasma processing chamber of the present invention, the following outstanding effects can be provided.

Since the pair of plasma electrodes provided in the processing chamber are brought into an excited electrode state (or hot state), without grounding, by connecting them with an output side of the high frequency power source, the voltage to be applied to both the plasma electrodes can be significantly increased by properly adjusting the impedance, as such increasing the plasma density as well as enhancing the efficiency of generating plasma.

BRIEF DESCRIPTION OF THE DRAWINGS

FIGS. 6(A) to 6(C) are graphs showing changes of the phase difference of the voltage wave form.

DETAILED DESCRIPTION OF THE INVENTION

EXAMPLES

Hereinafter, one example of a plasma treating apparatus according to the present invention will be described with reference to attached drawings.

Figure 1:
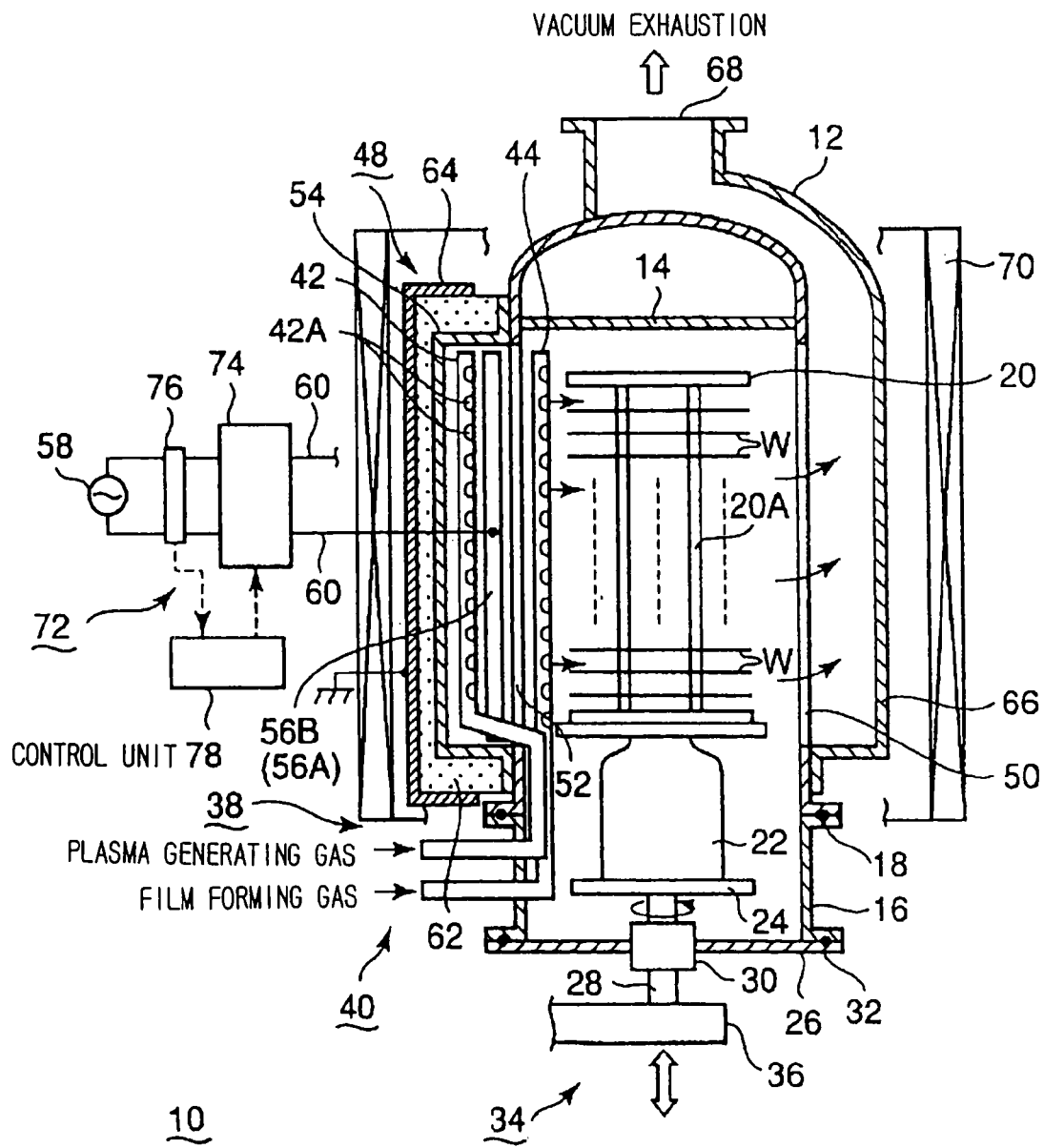
FIG. 1 is a longitudinal section for illustrating a construction of one example of a plasma treating apparatus according to the present invention.
Figure 2:
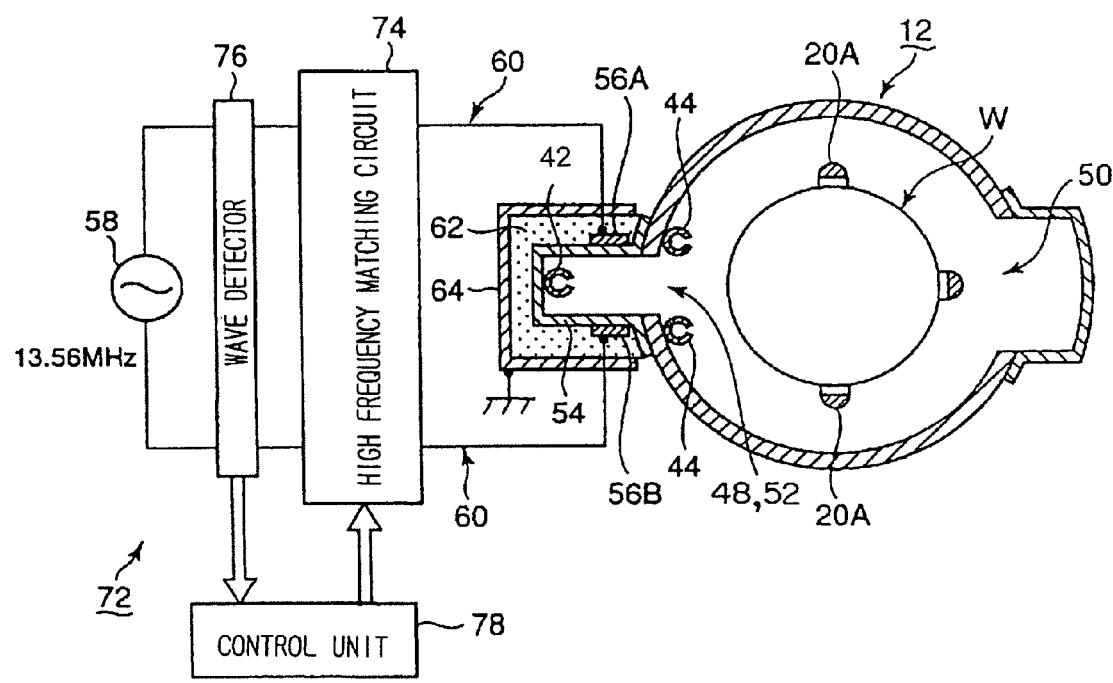
FIG. 2 is a transverse section illustrating a plasma treating apparatus.
Figure 3:
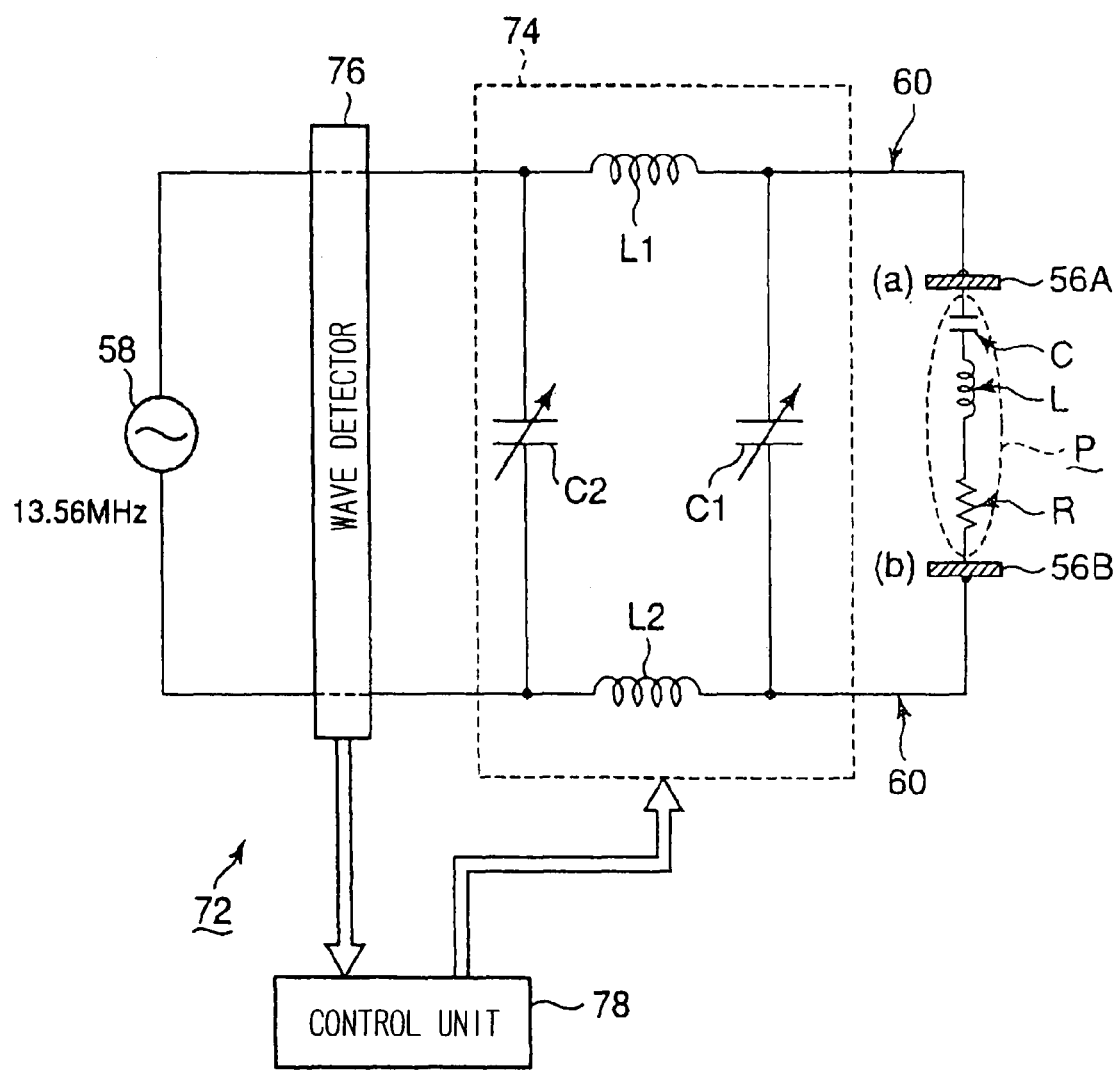
FIG. 3 shows an equivalent circuit of a high frequency circuit connected with a high frequency power source.

FIG. 1 is a longitudinal section for illustrating one example a plasma treating apparatus according to the present invention. FIG. 2 is a transverse section illustrating the plasma treating apparatus (a heating means is not shown in the drawing). FIG. 3 shows an equivalent circuit of a high frequency circuit connected with a high frequency power source. Now, an example in which an ammonia gas is used as a plasma generating gas and a silicon nitride (SiN) film is formed by the plasma CVD using a hexachlorodisilane gas (hereinafter, referred to as a "HCD" gas) as a film forming gas will be described.

As shown in the drawings, a plasma treating apparatus 10 includes a cylindrical processing chamber 12 with a ceiling having an opening formed at its bottom end. The entire body of the processing chamber 12 is formed of, for example quartz, and a quartz ceiling plate 14 is provided at the ceiling of the interior of the processing chamber 12 to seal the interior. A manifold 16 which is formed from, for example stainless steel, into a cylindrical body is coupled to the bottom end opening of the processing chamber 12 via a sealing member 18, such as an O-ring.

The bottom end of the processing chamber 12 is supported by the manifold 16, and a wafer boat 20 formed of quartz can be inserted and retracted vertically from below the manifold 16. The wafer boat 20 serves as a holding means for holding objects to be treated, on which multiple sheets of semiconductor wafers W as the objects to be treated are placed in a multi-staged fashion. In this example, struts 20A of the wafer boat 20 are designed to support, for example, 30 sheets of wafers each having a 300 mm diameter, at an approximately equal pitch, in a multi-staged fashion.

The wafer boat 20 is mounted on a table 24 via a heat insulating cylinder 22 made of quartz, and the table 24 is supported on a rotary shaft 28 extending through a cover 26 formed of, for example, stainless steel, which serves to open and close the bottom end of the manifold 16.

In the portion that the rotary shaft 28 extends through, a magnetic fluid seal is provided so as to seal the rotary shaft 28 airtightly and support it rotatably. A sealing member 32 made of, for example, an O-ring is provided at the periphery of the cover 26 and the bottom end of the manifold 16 so as to keep the interior of the chamber in a sealed state.

The rotary shaft 28 is attached to a distal end of an arm 36 supported by a lifting mechanism 34, such as a boat elevator, and is configured to lift and lower or insert and retract the wafer boat 20 and cover 26 integrally, relative to the interior of the processing chamber 12. It is noted that the table 24 may be fixed to the cover 26, and that the treatment for the wafers W may be performed without rotating the wafer boat 20.

In the manifold 16, a plasma gas supplying means 38 for supplying a plasma generating gas to be treated to generate plasma, for example, an ammonia ($NH_3$) gas into the processing chamber 12, and a film forming gas supplying means 40 for supplying a film forming gas, for example, an HCD gas as a silane-based gas into the chamber 12 are provided. Specifically, the plasma gas supplying means 38 has a plasma gas dispersing nozzle 42 formed of a quartz tube, which extends into and through a side wall of the manifold 16 and bending upward. In the plasma gas dispersing nozzle 42, a plurality of (multiple) gas injecting apertures 42A are formed along the length of the nozzle 42 and spaced apart from each other at a predetermined interval so that the ammonia gas can be injected, in a substantially uniform manner, horizontally from each gas injecting aperture 42A.

Similarly, the film forming gas supplying means 40 has also film forming gas dispersing nozzles 44 each formed of a quartz tube, extending into and though a side wall of the manifold 16 and bending upward. In this example, two film forming gas dispersing nozzles 44 are provided (see FIG. 2). In each film forming gas dispersing nozzle 44, a plurality of (multiple) gas injecting apertures 44A are formed along the length of the nozzle 44 and spaced apart from each other at a predetermined interval so that the silane-based gas can be injected, in a substantially uniform manner, horizontally from each gas injecting aperture 44A.

At a portion of a side wall of the processing chamber 12, a plasma generator 48 is provided along the vertical direction, and an elongated exhaust hole 50 is provided, for example, by cutting off a portion of a side wall of the processing chamber 12 on the opposite side of the plasma generator 48 across the processing chamber 12. The exhaust hole 50 serves to discharge, due to vacuum, an ambient gas in the interior of the processing chamber 12.

Specifically, the plasma generator 48 is formed to be integrated with the chamber by forming a vertically elongated opening 52 by cutting off a portion of a side wall of the processing chamber 12 along the vertical direction in a predetermined width, and by welding and joining airtightly a vertically elongated plasma partition wall 54 formed of, for example quartz and having a concave cross section to the outer wall of the chamber such that the partition wall 54 can cover the opening 52 from the outside. In such a way, by deforming a portion of the side wall of the processing chamber 12 outside to have a concave cross section, a plasma generator 48 which is opened to and in communication with the interior of the processing chamber 12 at its one side can be formed. Namely, the space in the interior of the plasma generator 48 is integrally communicating with the interior of the processing chamber 12. The opening 52 is formed to have a vertical length sufficient to cover all of the wafers W held by the wafer boat 20 in the vertical direction.

On outer surfaces of both side walls of the plasma partition wall 54, a pair of elongated plasma electrodes 56A, 56B are provided, opposing to each other, along the longitudinal direction (vertical direction). To the plasma electrodes 56A, 56B, a high frequency power source 58 for generating plasma is connected via wirings 60 so as to generate plasma by applying a high frequency voltage of, for example 13.56 MHz, to the plasma electrodes 56A, 56B. It is noted that the frequency of the high frequency voltage is not limited to 13.56 MHz, but may be other frequencies, including 400 kHz for example.

The plasma gas dispersing nozzle 42 extending upward in the processing chamber 12 is bent radially outward in the middle of the extension in the processing chamber 12, directed at the most back portion (the farthest portion from the center of the processing chamber 12) in the plasma generator 48, and raised upward along the most back portion. Accordingly, the ammonia gas injected from the gas injecting apertures 42A of the plasma gas dispersing nozzle 42 is decomposed or otherwise activated by plasma so as to flow toward the center of the processing chamber 12 while being dispersed.

On the outside of the plasma partition wall 54, an insulation protecting cover 62 formed of, for example quartz, is attached such that the insulation protecting cover 62 covers the plasma partition wall 54. Again, on the outside of the insulation protecting cover 62, a shield 64 is provided in order to cover the protecting cover 62 and prevent leakage of high frequency plasma. In this case, the shield is grounded.

The two film forming gas dispersing nozzles 44 are provided, while being raised, in the vicinity of the outside of the opening 52 of the plasma generator 48, i.e., on both outsides of the opening 52 (in the processing chamber 12), such that a silane-based gas can be injected toward the center of the processing chamber 12 from each gas injecting aperture 44A provided in the gas dispersing nozzles 44.

At the exhaust hole 50 provided opposing to the plasma generator 48, an exhaust hole covering member 66 which is formed of quartz and molded to have an U-shaped cross section is attached by welding to cover the exhaust hole 50. The exhaust hole covering member 66 extends upward along the side wall of the processing chamber 12 and is configured to be vacuumed by a vacuum exhausting system provided with a vacuum pump or the like (not shown) via an upper gas exit 68. A cylindrical heating means 70 is provided surrounding the outer periphery of the processing chamber 12 so as to heat the processing chamber 12 and wafers W placed therein.

A high frequency matching means 72 which is one of features of the present invention is provided in the middle of the wirings 60 respectively connecting the high frequency power source 58 with both the plasma electrodes 56A, 56B. Specifically, both the plasma electrodes 56A, 56B are connected with the output side of the high frequency power source 58 via the wirings 60 without being grounded, as such creating an excited electrode state, i.e., a hot state. The high frequency matching means 72 is composed of a high frequency matching circuit 74 provided in the wirings 60, a wave detector 76 connected in parallel with the high frequency matching circuit 74 and adapted to detect a reflected wave generated on the side of the plasma electrodes 56A, 56B, and a control unit 78 adapted to adjust and control impedance of the high frequency matching circuit 74 based on an output from the wave detector 76 and including, for example a microcomputer, or the like. An equivalent circuit for a high frequency circuit in this case is shown in FIG. 3.

In FIG. 3, the plasma P generated between the plasma electrodes 56A, 56B will act as a load for the high frequency power source 58, and the plasma P can be equivalently expressed as a series circuit composed of a capacitor C, a coil L and a resistance R. The high frequency matching circuit 74 is composed of two coils L1, L2 respectively connected in series with the plasma electrodes 56A, 56B, and two capacitors C1, C2 respectively connected in parallel with the load of plasma P. The coils L1, L2 constitute together inductive reactance as first reactance elements, while the capacitors C1, C2 constitute together capacitive reactance as second reactance elements. In this case, both of the capacitors C1, C2 are variable. The capacitor C1 is connected between the wirings 60 nearer to the plasma electrodes 56A, 56B than the coils L1, L2, while the other coil C2 is connected between the wirings 60 farther from the plasma electrodes 56A, 56B than the coils L1, L2, thus constituting the so-called π shaped matching circuit.

Next, a plasma treating method which is performed by using the plasma treating apparatus as constructed described above will be discussed. As a plasma treatment, a case of subjecting the wafer surface to plasma CVD so as to form a silicon nitride film will be described.

First, the wafer boat 20 on which multiple sheets, for example 50 sheets, of wafers each having a 300 mm diameter are placed at a normal temperature, is loaded in the processing chamber 12 set at a predetermined temperature by lifting the wafer boat 20 from below, and the interior of the processing chamber 12 is then sealed by closing the bottom opening of the manifold 16 due to the cover 26.

Thereafter, the interior of the processing chamber 12 is kept at a predetermined processing pressure by providing vacuum thereto, while the electric power to be applied to the heating means 70 is increased. In this way, the wafer temperature is elevated to maintain a processing temperature. In addition, various types of processing gases are supplied alternately and intermittently from the plasma gas supplying means 38 and film forming gas supplying means 40 so as to form a silicon nitride film on a surface of each wafer W supported on the rotating wafer boat 20.

Specifically, the $NH_3$ gas is injected horizontally from each gas injecting aperture 42A of the plasma gas dispersing nozzle 42 provided in the plasma gas generator 48, while the HCD gas as the film forming gas is injected horizontally from each gas injecting aperture 44A of the film forming gas dispersing nozzle 44, thus both of the gases react with each other so as to form a silicon nitride film. In this case, a high frequency voltage generated from the high frequency power source 58 is applied between the plasma electrodes 56A, 56B of the plasma generator 48. In this way, the $NH_3$ gas injected from the gas injecting apertures 44A of the plasma gas dispersing nozzle 44 flows in a space between the plasma electrodes 56A, 56B to which a high frequency voltage is applied, thus the $NH_3$ gas is changed into plasma and then activated, thereby generating radicals (active species) including N*, NH*, NH2*, NH3* (the symbol * means a radical). These radicals are then released and diffused toward the center of the processing chamber 12 from the opening 52 of the plasma generator 48, thus flowing in a laminar flow state between the wafers W. Consequently, each radical reacts with molecules of the HCD gas attached to the surface of each wafer W, thus forming a silicon nitride film as described above.

During the film forming operation as described above, the reflected wave from the plasma P is detected by the wave detector 76 as shown in FIGS. 2 and 3, and the control unit 78 automatically controls the impedance of the high frequency matching circuit 74 such that the reflected wave becomes "zero", thereby performing the matching. In the case shown in FIG. 3, the values of the respective capacitors C1, C2 are suitably adjusted. For example, if the impedance of the load due to the plasma P is "a+jb", the control unit 78 adjusts the load of the high frequency matching circuit 74 and plasma P at "50Ω".

When the impedance is matched as described above, assuming that the composite impedance of the capacitors C1, C2 is "−j/(ωC)" and that the impedances of the coils L1, L2 are "+jωL1" and "+jωL2", respectively, the imaginary number part becomes zero, thereby obtaining the following equation.

$$\omega L1 + \omega L2 - 1/(\omega C) = 0$$

Figure 4:
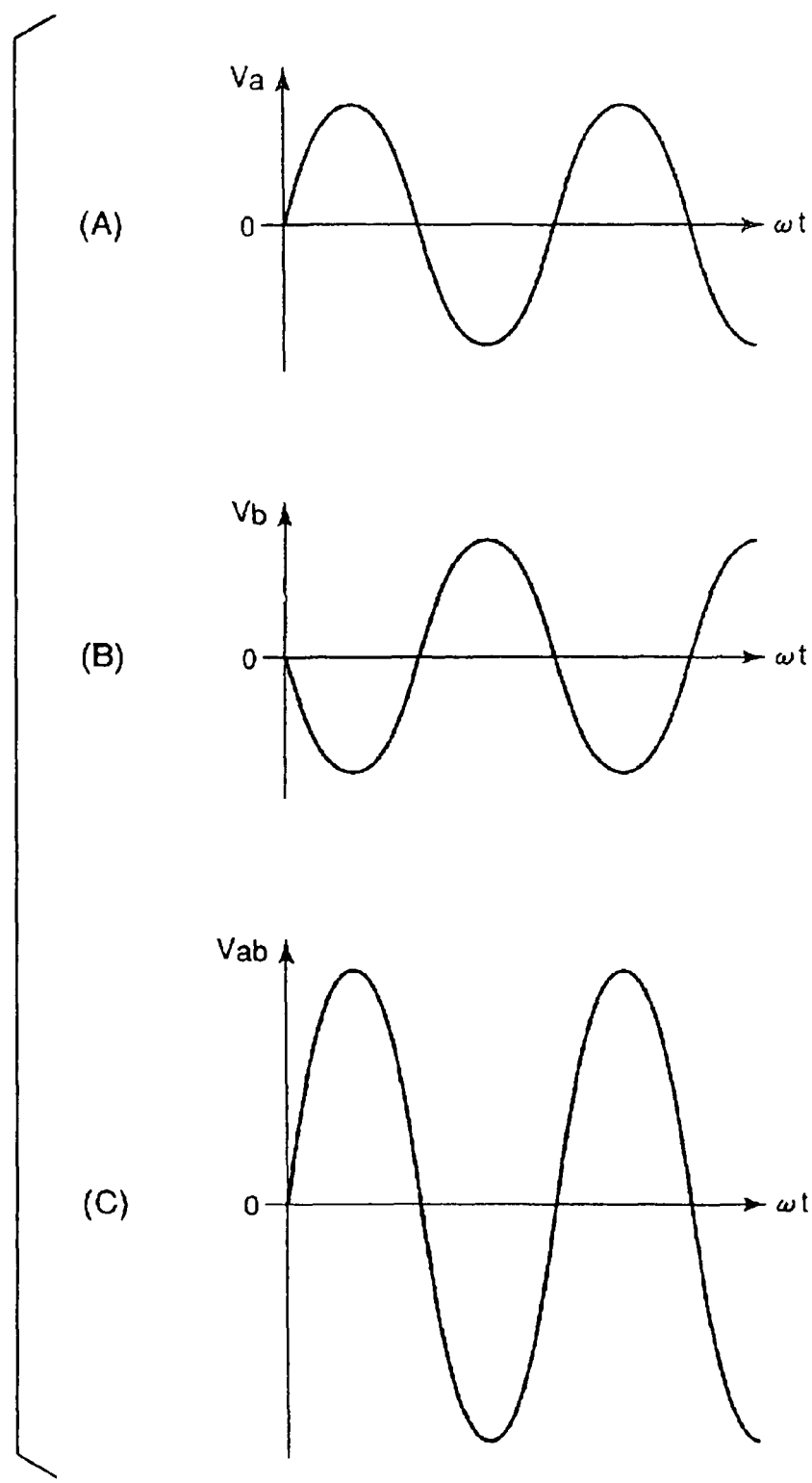
FIGS. 4(A) to 4(C) are graphs showing potentials measured at both ends of the plasma load and a composite potential thereof.

Accordingly, the potentials at both ends of the load in the plasma P, i.e., the potentials at the plasma electrode 56A (point a) and plasma electrode 56B (point b) are shifted in phase by 180 degrees as shown in FIGS. 4(A) and 4(B).

FIGS. 4(A) to 4(C) are graphs showing potentials measured at both ends of the plasma load and a composite potential thereof. FIG. 4(A) shows potential Va at one of the plasma electrodes 56A (point a), and FIG. 4(B) shows potential Vb at the other plasma electrode 56B (point b). Accordingly, the neutral point, i.e., zero point of the potential is around a half of the load in the plasma P, and this point corresponds to an imaginary grounded point. As a result, the difference of potentials Vab (=Va−Vb) between both of the electrodes 56A, 56B is changed with twice the magnitude of amplitude as shown in FIG. 4(C).

Figure 8:
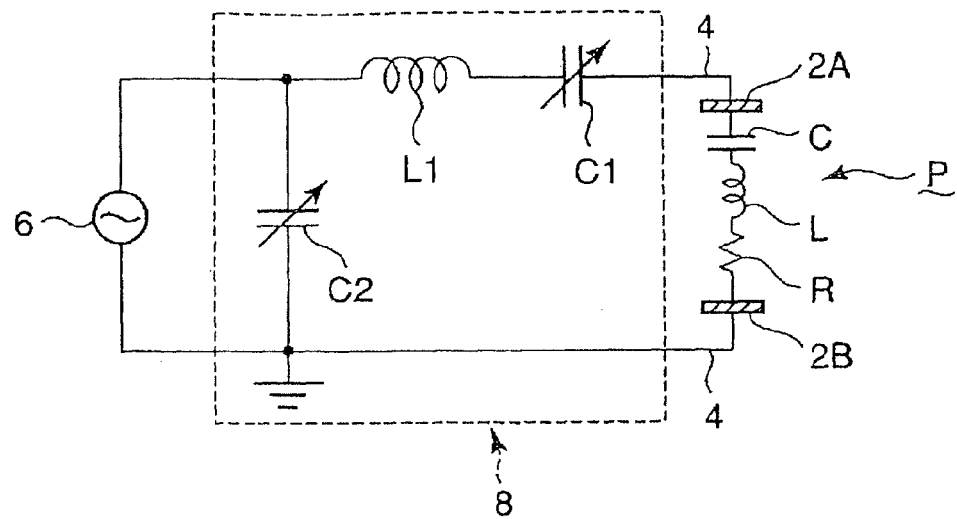
FIG. 8 shows an equivalent circuit of a conventional high frequency circuit including a high frequency power source.
Figure 9:
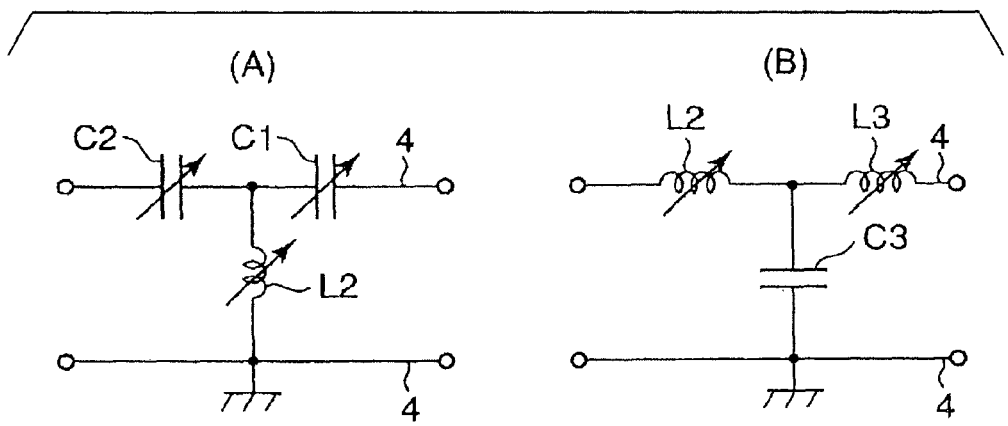
FIGS. 9(A) and 9(B) are diagrams for illustrating other constructions of the conventional high frequency matching circuit.
Figure 10:
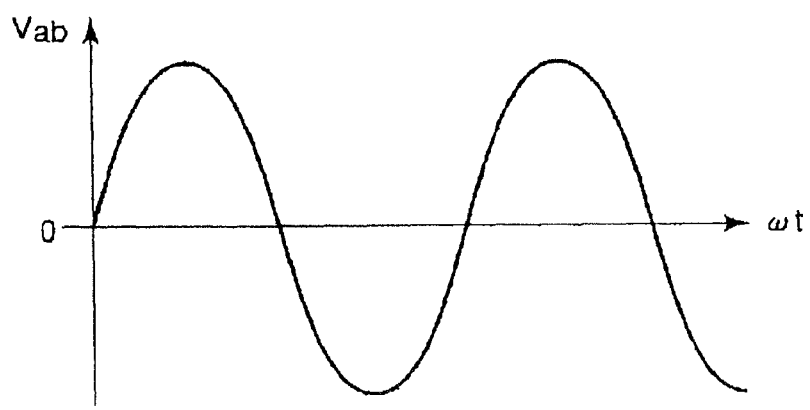
FIG. 10 shows a voltage wave form applied to both of the plasma electrodes due to the conventional high frequency matching circuit.

As described above, by bringing both of the electrodes 56A, 56B into an ungrounded excited electrode state (or into a hot state), substantially the doubled voltage can be applied, as compared with the case where either one of the electrodes 56A, 56B is grounded as in the conventional high frequency circuit shown in FIG. 8. Consequently, the plasma density can be increased as well as the efficiency of generating plasma can be enhanced.

As discussed above, by bringing both of the electrodes 56A, 56B into an ungrounded excited electrode state (or into a hot state), the area of each electrode can be increased, and the electric power (voltage) per unit area can be controlled for that increase. In this way, the reduction of the potential difference by controlling the electric power per unit area can lead to control of damage to be given to the plasma electrodes 56A, 56B and processing chamber 12 (or plasma partition wall 54) due to ions in the plasma P.

Figure 5:
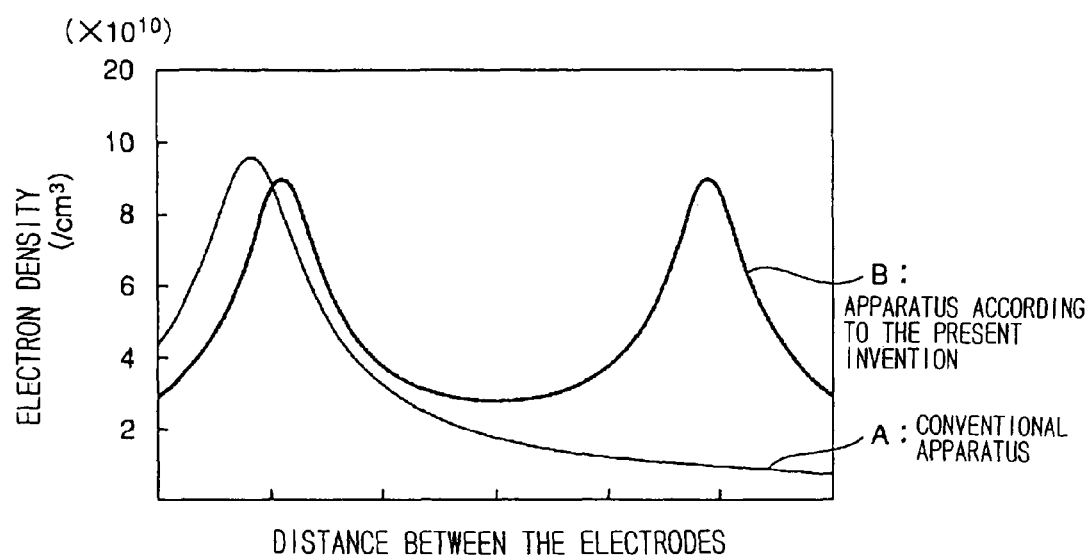
FIG. 5 is a graph showing distribution of the plasma density of a conventional apparatus and an apparatus according to the present invention.

FIG. 5 shows plasma densities between the plasma electrodes measured by a simulation. In FIG. 5, curve A shows distribution of the plasma density of a conventional apparatus while curve B shows the plasma density of an apparatus according to the present invention. As shown in FIG. 5, the curve A of the conventional apparatus expresses only one peak of the plasma density around the electrode on the left side, i.e., the electrode in a hot state. On the contrary, the curve B of the apparatus of the present invention shows two peaks appearing respectively around both of the electrodes, thus enhancement of the plasma density can be confirmed over the whole range.

As shown in FIGS. 4(A) and 4(B), while the voltage wave form shown in FIG. 4(B) is shifted in phase by 180 degrees relative to the voltage wave form in FIG. 4(A), the potential difference of the voltage wave form shown in FIG. 4(B) can be adjusted by suitably modifying the variable capacitors C1, C2 shown in FIG. 1. FIG. 6(A) shows the same voltage wave form as that in FIG. 4(A), FIG. 6(B) shows a voltage wave form shifted in phase by 90 degrees relative to the wave form of FIG. 6(A), and FIG. 6(C) shows a wave form shifted in phase by 180 degrees relative to the wave form of FIG. 6(A).

In this way, since the phase of voltage between the plasma electrodes 56A, 56B can be changed as needed, the plasma density can be altered as well as the time-dependent stability of plasma can be modified, as required, thereby obtaining an optimum plasma density for any given process.

It is noted that while both of the capacitors C1, C2 are variable in the apparatus shown in FIG. 1, the configuration of the present invention is not limited to this aspect, but at least one reactance element among the two capacitive reactance elements consisting of the capacitors C1, C2 and the two inductive reactance elements consisting of the coils L1, L2 may be variable.

Figure 7:
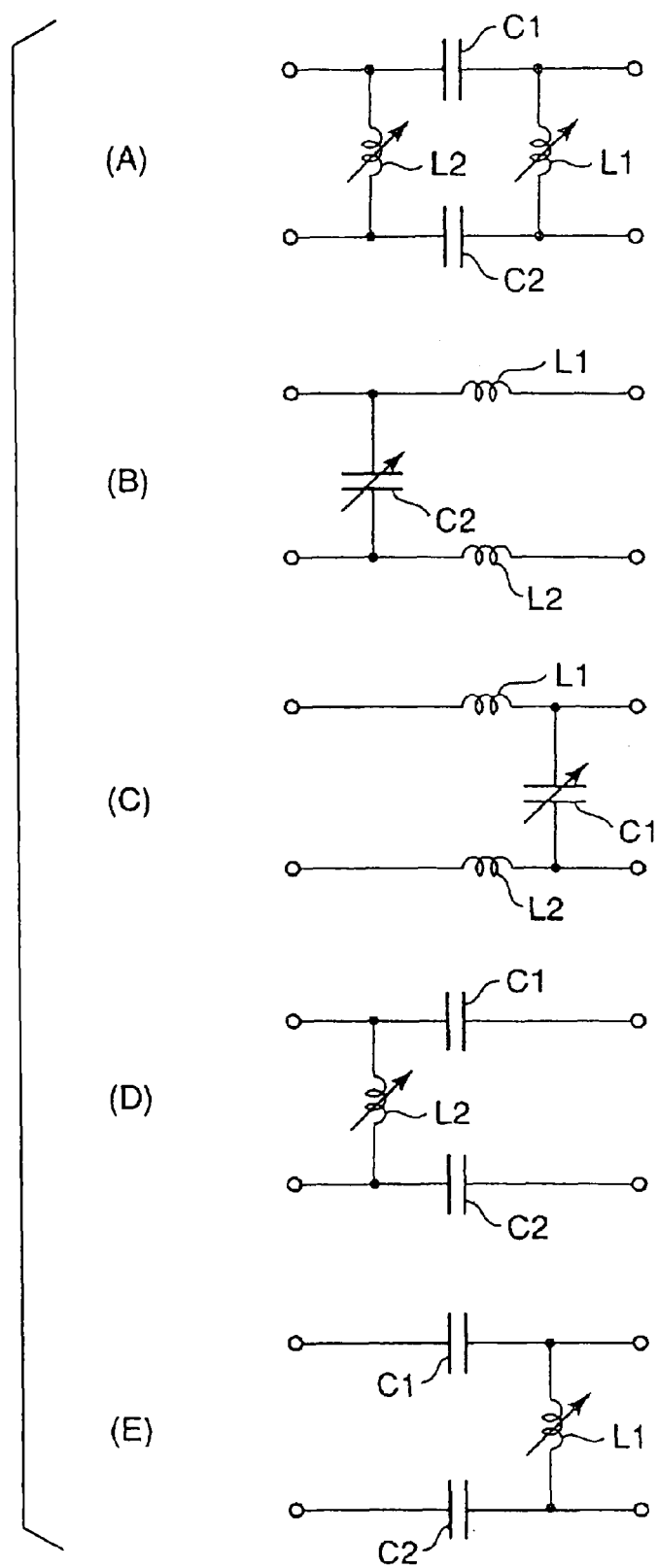
FIGS. 7(A) to 7(E) respectively show circuit diagrams as alternatives of a high frequency matching circuit.

The configuration of the high frequency matching circuit 74 is not limited to the one shown in FIG. 3, but may be configured as shown in FIG. 7, for example. FIG. 7 are circuit diagrams respectively showing modifications of the high frequency matching circuit. A circuit shown in FIG. 7(A) is configured to have a reversed connecting relation between the coils L1, L2 as the inductive reactance and the capacitors C1, C2 as the capacitive reactance. In the configuration, both the capacitors C1, C2 are connected in series with respective wires 60 extending from the load, while both the coils L1, L2 are connected in parallel with the wires across the capacitors C1, C2. In this case, both the coils L1, L2 are variable.

A circuit shown in FIG. 7(B) is configured such that one of the capacitors connected in parallel with the load in the circuit shown in FIG. 3, i.e., the capacitor C1 which is positioned nearer to the load is removed to create an opened state. A circuit shown in FIG. 7(C) is configured such that the other one of the capacitors connected in parallel with the load in the circuit shown in FIG. 3, i.e., the capacitor C2 which is positioned farther from the load is removed to provide an opened state. In either case, the capacitor C2 or capacitor C1 is variable.

A circuit shown in FIG. 7(D) is configured such that one of the coils connected in parallel with the load in the circuit shown in FIG. 7(A), i.e., the coil L1 which is positioned nearer to the load is removed to create an opened state. A circuit shown in FIG. 7(E) is configured such that the other one of the coils connected in parallel with the load in the circuit shown in FIG. 7(A), i.e., the coil L2 which is positioned farther from the load is removed to provide an opened state. In either case, the coil L2 or coil L1 is variable.

While an example of the film forming process for a silicon nitride film has been described above, other film forming processes for other types of films may be used. In addition, the present invention is not limited to the film forming process, but may be applied to the plasma etching process, plasma ashing process or the like.

Furthermore, while an example of a vertical batch type plasma treating apparatus which can process multiple sheets of semiconductor wafers at a time has been described, the present invention is not limited to this aspect, but may be applied to a sheet-fed type plasma treating apparatus adapted to process semiconductor wafers, one for each operation. In this case, a susceptor which is a holding means of an object to be processed and is adapted to hold a semiconductor wafer placed thereon and a shower head portion adapted to supply processing gases including a plasma gas constitute both of the plasma electrodes.

The object to be processed is not limited to semiconductor wafers, but this invention may also be applied to glass substrates or LCD substrates.

The invention claimed is:

1. A plasma treating apparatus adapted to provide a predetermined plasma treatment to an object to be treated, comprising:

a processing chamber capable of being vacuumed;

an object holding means adapted to hold an object;

a high frequency power source adapted to generate high frequency voltage;

a plasma gas supplying means adapted to supply a plasma generating gas to be treated to generate plasma to the processing chamber;

a first plasma electrode and a second plasma electrode providing a pair of plasma electrodes disposed to apply high frequency voltage to plasma generating gas supplied from the plasma gas supplying means and thereby generate plasma in the processing chamber, and connected to the output side of the high frequency power source;

a high frequency matching means, provided between the pair of plasma electrodes and the high frequency power source to connect the electrodes and the power source such that none of the high frequency matching means and the electrodes are grounded and each electrode is brought into an excited electrode state in a high frequency manner, for impedance matching based upon a load acting on the high frequency power source as a result of plasma generated in the processing chamber by the plasma electrodes, said load being detectable as a reflected wave at the plasma electrodes, the high frequency matching means including:

a wave detector for detecting said reflected wave and outputting a signal representative of said wave;

a high frequency matching circuit disposed such that the wave detector is between the high frequency matching circuit and the high frequency power source, the high frequency matching circuit having at least one first reactance element, and a control unit for causing, based on a reflected wave signal output from the wave detector, the high frequency matching circuit to match an impedance of said load by causing the plasma electrodes to generate a composite potential; and wiring for connecting the plasma electrode to the high frequency power source through the high frequency matching means, the wiring including:

a first wire extending from the first plasma electrode through the high frequency matching circuit to the wave detector, the first wire continuing to connect the wave detector to the high frequency power source to thereby connect the first plasma electrode to the output side of the source, and a second wire extending from the second plasma electrode through the high frequency matching circuit to the detector, the second wire continuing to connect the wave detector to the high frequency power source to thereby connect the second plasma electrode to the output side of the source wherein the first wire and the second wire are connected to each other through the at least one first reactance element, and neither the first wire nor the second wire is grounded.

2. The plasma treating apparatus according to claim 1, wherein the at least one first reactance element is connected by wires in parallel with the first and second wires and said load and has either a property of inductive reactance or of capacitive reactance, and the high frequency matching circuit has a plurality of second reactance elements connected by wires in series with the first and second wires extending from each plasma electrode and having another property different from that of the first reactance element.

3. The plasma treating apparatus according to claim 2, wherein at least either one of the first or second reactance elements is variable.

4. The plasma treating apparatus according to claim 1, wherein the control unit controls the impedance of the high frequency matching means such that the reflected wave generated on the side of the plasma electrodes becomes zero.

5. The plasma treating apparatus according to claim 3, wherein the apparatus has plural first reactance elements that comprise a pair of capacitors with variable capacitance; and wherein the second reactance elements comprise a pair of coils.

6. The plasma treating apparatus according to claim 3, wherein the apparatus has plural first reactance elements that comprise a pair of coils with variable inductance; and wherein the second reactance elements comprise a pair of capacitors.

7. The plasma treating apparatus according to claim 3, wherein the apparatus has plural first reactance elements that comprise a single capacitor with variable capacitance; and wherein the second reactance elements comprise a pair of coils.

8. The plasma treating apparatus according to claim 7, wherein the single capacitor is arranged, on the side of the plasma electrodes with respect to the pair of coils.

9. The plasma treating apparatus according to claim 7, wherein the single capacitor is arranged, opposite to the plasma electrodes with respect to the pair of coils.

10. The plasma treating apparatus according to claim 3, wherein the apparatus has plural first reactance elements that comprise a single coil with variable inductance; and wherein the second reactance elements comprise a pair of capacitors.

11. The plasma treating apparatus according to claim 10, wherein the single coil is arranged, on the side of the plasma electrodes with respect to the pair of capacitors.

12. The plasma treating apparatus according to claim 10, wherein the single coil is arranged, opposite to the plasma electrodes with respect to the pair of capacitors.

13. The plasma treating apparatus according to claim 1, wherein the processing chamber is a vertical type processing chamber which can contain multiple sheets of the objects to be treated.

14. The plasma treating apparatus according to claim 1, wherein the processing chamber is a sheet-fed type processing chamber which can contain one sheet of the object to be treated for each operation.

15. The plasma treating apparatus according to claim 1, wherein the control unit causes the high frequency matching means to set the composite potential by causing the potential of each electrode to have the same shape, and by causing the potential of at least one electrode be phase shifted to obtain a phase shift of 180%.

\* \* \* \* \*